United States Patent
Suzuki et al.

(10) Patent No.: US 8,577,944 B2
(45) Date of Patent: Nov. 5, 2013

(54) SIGNAL PROCESSING DEVICE, SIGNAL PROCESSING METHOD, AND SIGNAL LEVEL DISPLAY DEVICE

(75) Inventors: Shiro Suzuki, Kanagawa (JP); Yuuki Matsumura, Saitama (JP)

(73) Assignee: Sony Corporation, Tokyo (JP)

( * ) Notice: Subject to any disclaimer, the term of this patent is extended or adjusted under 35 U.S.C. 154(b) by 1133 days.

(21) Appl. No.: 12/511,498

(22) Filed: Jul. 29, 2009

(65) Prior Publication Data

US 2010/0026539 A1    Feb. 4, 2010

(30) Foreign Application Priority Data

Jul. 30, 2008  (JP) ................ P2008-196641

(51) Int. Cl.
*G06F 7/10*  (2006.01)
*G06F 7/38*  (2006.01)

(52) U.S. Cl.
USPC ............ 708/300; 708/305; 708/306; 708/309

(58) Field of Classification Search
None
See application file for complete search history.

(56) References Cited

U.S. PATENT DOCUMENTS 6,487,252  B1 *  11/2002  Kleider et al. ............... 375/260

FOREIGN PATENT DOCUMENTS

| JP | 2003-16767 | 1/2003 |
|---|---|---|
| JP | 2008-141470 | 6/2006 |
| JP | 2006-140962 | 6/2008 |

OTHER PUBLICATIONS

Office Action corresponding to Japanese Patent No. 2008-196641.

* cited by examiner

*Primary Examiner* — Scott Sun
(74) *Attorney, Agent, or Firm* — Finnegan, Henderson, Farabow, Garrett & Dunner, LLP

(57) ABSTRACT

A signal processing device includes a bit-pattern output unit and a look-up table storage unit which are configured as follows: The bit-pattern output unit is provided for receiving input 1-bit digital signals generated by ΔΣ modification and aligning bits of the input 1-bit digital signals in a chronological order to output parallel bit pattern. The look-up table storage unit is provided for storing a look-up table that represents a relationship between the bit patterns output from the bit pattern output unit and resulting values of a filtering arithmetic operation on the basis of the bit patterns. In the signal processing device, the bit patterns output from the bit-pattern output unit are provided as indexes. The indexes are referenced to output the resulting values of the filtering arithmetic operation corresponding to the bit patterns listed in the look-up table stored in the look-up table storage unit.

23 Claims, 12 Drawing Sheets

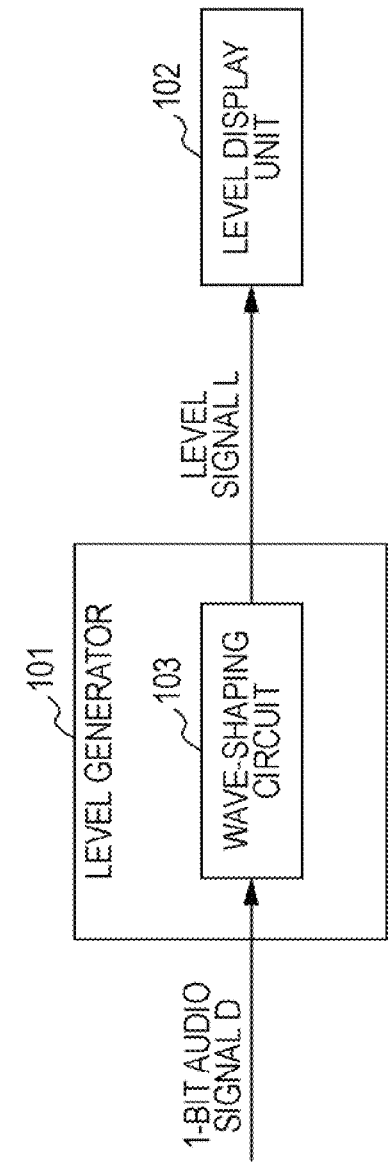

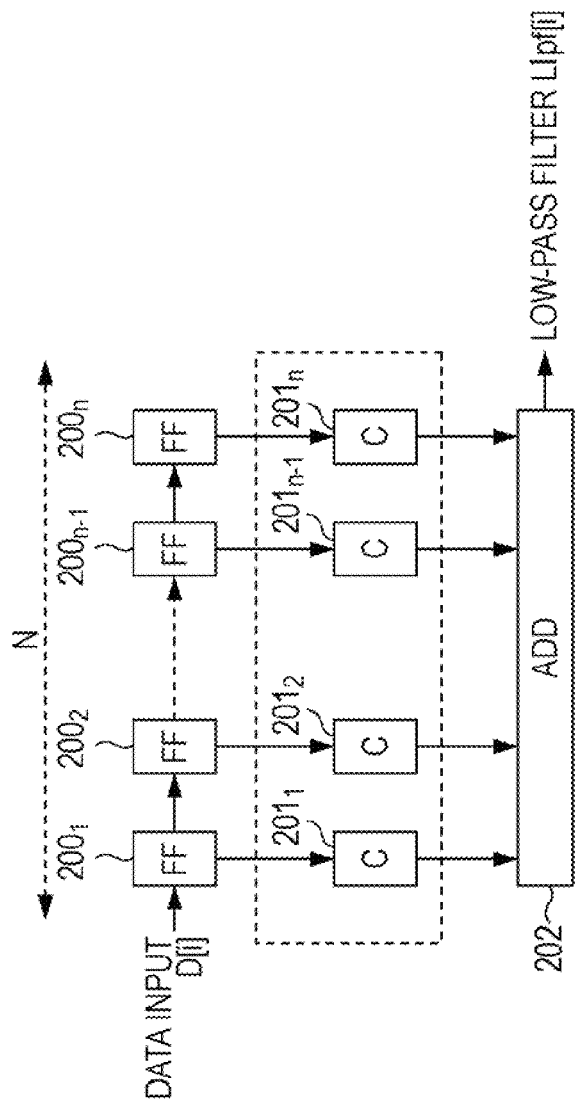
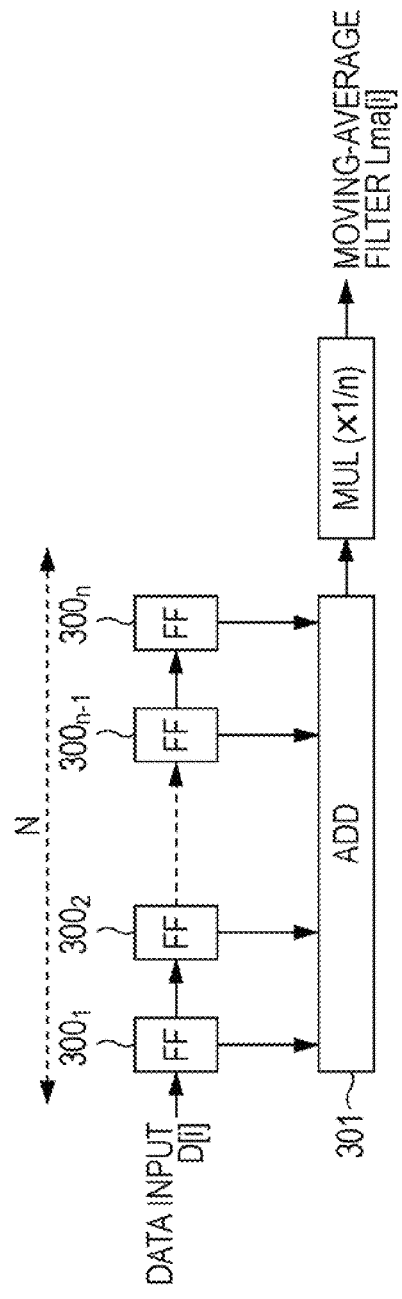
FIG. 2A
FIG. 2B

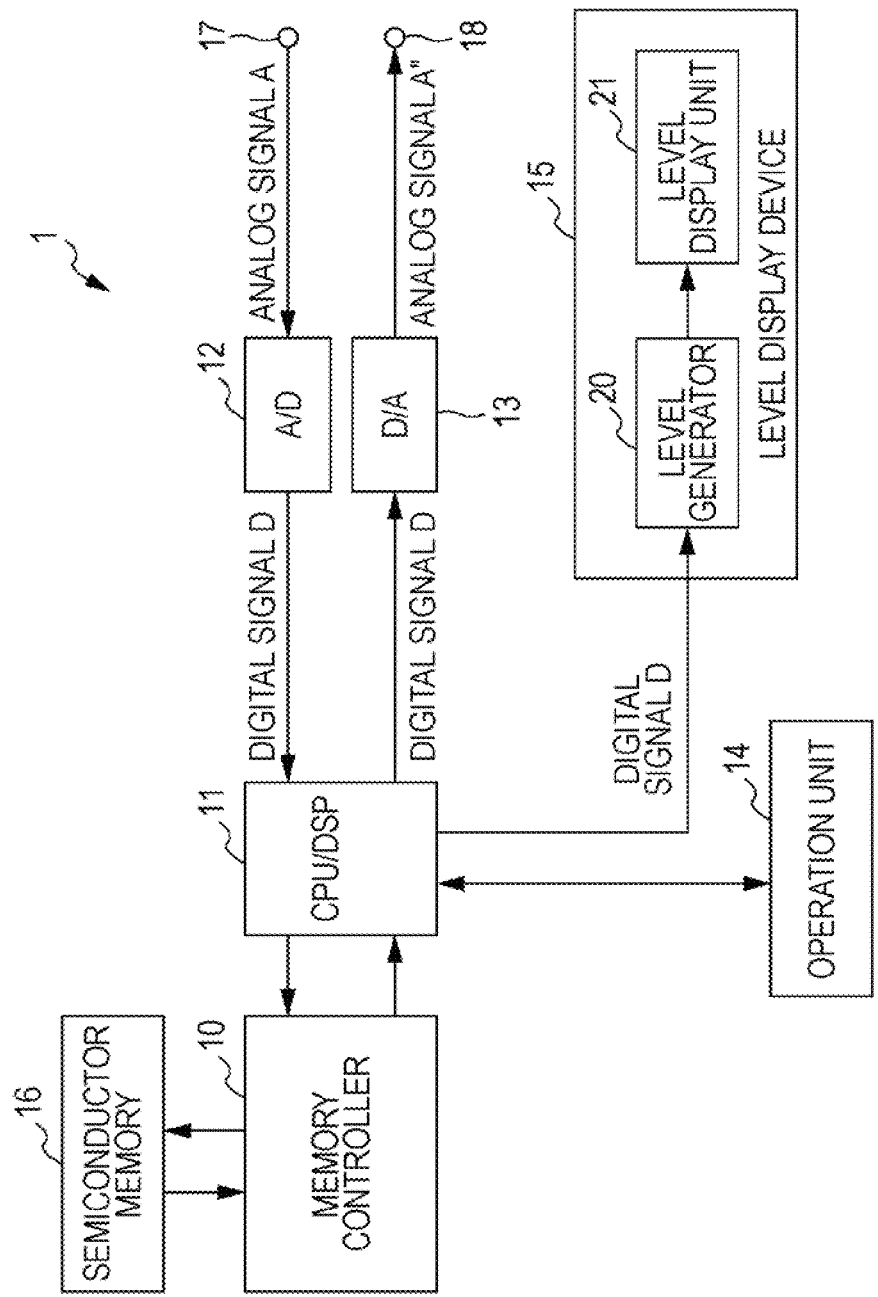

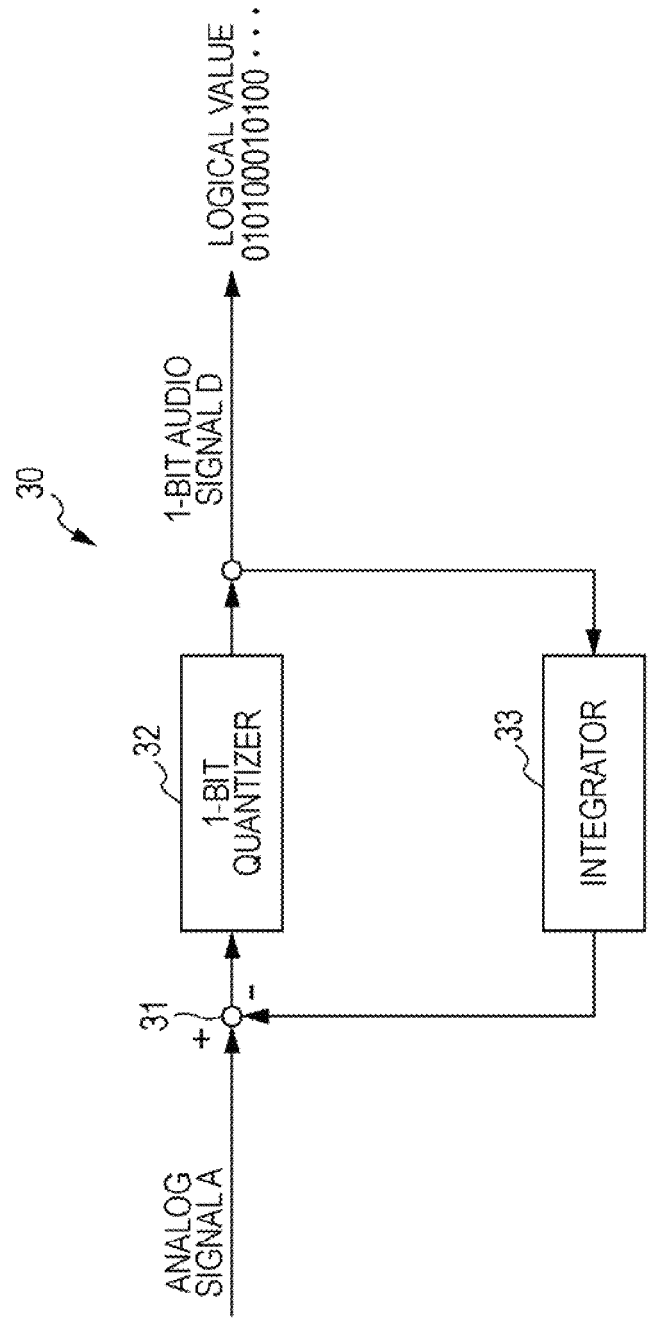

_US 8,577,944 B2_

SIGNAL PROCESSING DEVICE, SIGNAL PROCESSING METHOD, AND SIGNAL LEVEL DISPLAY DEVICE

BACKGROUND OF THE INVENTION

1. Field of the Invention

The present invention relates to a signal processing device, a signal processing method, particularly a signal processing device for processing a 1-bit digital signal obtained by a $\Delta\Sigma$ modulation.

The present invention also relates to a signal processing method to be applied to the above signal processing device.

The present invention further relates to a signal-level display device for displaying a signal level processed by the signal processing device.

2. Description of the Related Art

Super Audio Compact Disc (SACD) (trade name) has been known in the art. For example, in contrast to Compact Disc (CD) that store one sample as a multi-bit audio signal (16 bits) per each channel by the PCM system with a sampling frequency (fs) of 44.1 KHz.

In recent years, a method and device for recording/reproducing 1-bit audio signals into/from recordable/rewritable DVDs and semiconductor memories have been also proposed.

In many cases, such an audio device is provided with a level meter for confirming the volume of recording/reproduction sound.

In the PCM system, each sample represents a level (amplitude information) itself. Thus, it is easy to display the level of audio data on a level meter.

However, in the case of a 1-bit audio signal recorded on the above SACD, it realizes a high S/N ratio by a noise-shaping technique. Thus, the 1-bit audio signal has an additional frequency component out of a human audible frequency range (approximately 20 kHz). The component out of the audible range is almost removed by an analog LPF, so that there is a problem that a signal level in the audible range is not found even only in a 1-bit audio signal.

Therefore, an operation has been performed such that a signal component in the audible range is taken out by carrying out a low-pass filtering process on a 1-bit audio signal and the signal component is then converted into a multi-bit audio signal to take out a signal level.

Specifically, as shown in FIG. 1, the level generation of the related-art recording/reproducing apparatus is carried out as follows: At the time of both the recording and reproducing operations, a level generator 101 receives 1-bit audio signals D one by one and then subjects the input signal to a filtering arithmetic operation in a filter FLT 103 with a tap length of N to generate a level signal L, followed by supplying the level signal L to a level display unit 102.

As an example of the above level generation, FIG. 2A is a block diagram that represents a filter for carrying out a low-pass filtering process with a tap length of n. Input data D[i], which are sequentially entered and stored in memory FFs $200_1$ to $200_n$, are multiplied by low-pass filter factors $C201_1$ to $201_n$ and then added to an ADD unit 202 as much as the number of the taps N, thereby obtaining a low-pass output Llpf[i]. Subsequently, the low-pass output Llpf[i] is displayed on a level display unit. To perform the process, a 1-bit audio signal D does not use logical values (0/1) but actual values (−1/+1).

In addition, a moving-average filtering operation may be used as a method of realizing a low-pass filter in the absence of filter factors C. FIG. 2B is a block diagram illustrating a moving-average filter for performing a moving-average filtering operation. Input data D[i] sequentially inputted and stored in memory FFs $300_l$ to $300_n$ are added by an adder 301. The result of the addition is then divided by the tap length n (1/n). As a result, a moving average output Lma[i] is obtained and displayed on a level display unit. Since the low-pass characteristic of the moving-average filtering operation is uniquely defined, the flexibility of the moving-average filter is lower than that of a low-pass filter using arbitrary filter factors C. However, it may be sufficient for level generation. To perform the process, a 1-bit audio signal D does not use logical values (0/1) but actual values (−1/+1).

Furthermore, there is proposed a method of generating a level by carrying out a process equal to a moving-average filtering operation without performing a filtering operation to count the number of logical values 0 and 1 in a predetermined number N of 1-bit audio signals (see, for example, Japanese Published Patent Application No. 2003-16767).

SUMMARY OF THE INVENTION

However, even when the above low-pass filtering process is carried out, a moving-average filtering operation is carried our, or a countering process is carried out, the related-art method of level generation typically performs a filtering arithmetic operation on each of 1-bit audio signals every sample and also performs a product-sum operation. In addition, the 1-bit audio signal used in this method has an extremely high sampling frequency of 64 fs (=2.8224 MHz), resulting in a huge amount of arithmetic operation per unit of time.

Therefore, the related-art method of level generation applies a large amount of load to the whole system irrespective of hardware or software, causing increases in circuit size, cost, consumption electric power, and so on.

The present invention has been made in consideration of the above problems. It is desirable to provide a signal processing device/method for obtaining a result, which is substantially equal to one obtainable by a product-sum operation, at high speed in signal processing of a 1-bit digital signal without performing a product-sum operation.

For overcoming the aforementioned problems, an embodiment of the present invention is a signal processing device including a bit-pattern output unit and a look-up table storage unit which are configured as follows: The bit-pattern output unit is provided for receiving input 1-bit digital signals generated by $\Delta\Sigma$ modification and aligning bits of the input 1-bit digital signals in a chronological order to output parallel bit pattern. The look-up table storage unit is provided for storing a look-up table that represents a relationship between the bit patterns output from the bit pattern output unit and resulting values of a filtering arithmetic operation on the basis of the bit patterns. In the signal processing device, the bit patterns output from the bit-pattern output unit are provided as indexes. The indexes are referenced to output the resulting values of the filtering arithmetic operation corresponding to the bit patterns listed in the look-up table stored in the look-up table storage unit.

Another embodiment of the present invention is a signal processing method including the steps of: previously generating a look-up table storage unit that represents a relationship between parallel bit patterns prepared by aligning sequentially received input 1-bit digital signals in chronological order and resulting values of a filtering arithmetic operation on the basis of the bit patterns; receiving input 1-bit digital signals generated by $\Delta\Sigma$ modification; aligning bits of the input 1-bit digital signals in a chronological order to output parallel bit pattern; indexing the bit patterns output from the bit-pattern output unit; and using the indexes to output the resulting values of the filtering arithmetic operation corresponding to the bit patterns listed in the look-up table stored in the look-up table storage unit.

A further embodiment of the present invention is a signal level display device that includes a pit-pattern output unit, a look-up table storage unit, a signal level display unit which are configured as follows: The bit-pattern output unit is provided for receiving input 1-bit digital signals generated by ΔΣ modification and aligning bits of the input 1-bit digital signals in a chronological order to output parallel bit pattern. The look-up table storage unit is provided for storing a look-up table that represents a relationship between the bit patterns output from the bit pattern output unit and resulting values of a filtering arithmetic operation on the basis of the bit patterns. The signal level generator is provided for using the bit patterns output from the bit-pattern output unit as indexes to output the resulting values of the filtering arithmetic operation corresponding to the bit patterns listed in the look-up table stored in the look-up table storage unit. The signal level display unit is provided for displaying a signal level based on the resulting values of the filtering arithmetic operation output from the signal level generator.

According to any embodiment of the present invention, a signal level is generated at high speed by a simple circuit because of the follows: First, a look-up table that represents the results of a filtering arithmetic operation is stored in advance and input 1-bit audio signals are considered as bit patterns to be used as indexes. Then, the results of the filtering arithmetic operation corresponding to the indexes are output from the look-up table.

BRIEF DESCRIPTION OF THE DRAWINGS

FIG. 1 is a block diagram illustrating a related-art level display device;

FIG. 2 illustrates a filtering arithmetic operation in the related-art level display device, where FIG. 2A is a block diagram illustrating a filter for performing a low-pass filtering process with a tap length of N on 1-bit audio signals D[i] and FIG. 2B is a block diagram illustrating a filter for performing a moving-average filtering operation;

FIG. 3 is a block diagram illustrating a semiconductor memory recording/reproducing apparatus using a level-generating method according an embodiment of the present invention;

FIG. 4 is a block diagram illustrating the configuration of a configuration of a ΔΣ modulator;

FIG. 11 illustrates tables used in the embodiment of the present invention, where

DESCRIPTION OF THE PREFERRED EMBODIMENTS

Figure 5:
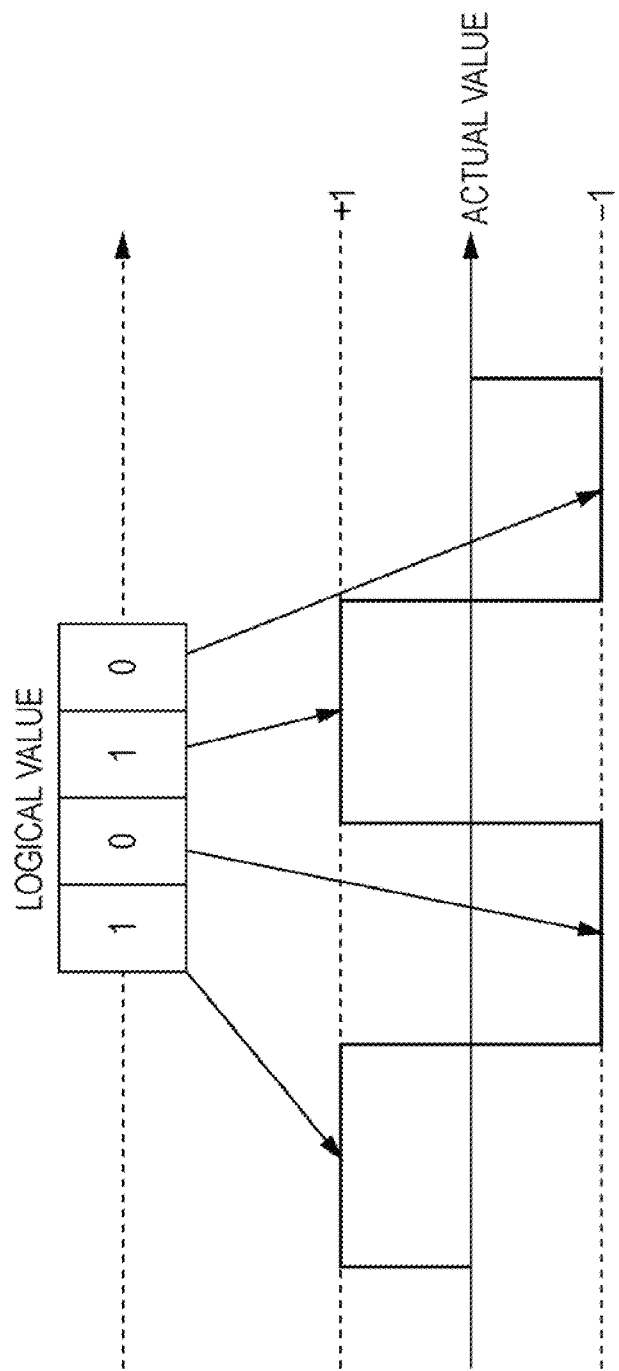
FIG. 5 is a schematic diagram illustrating the relationship between a logical value and an actual value.

Hereafter, some of embodiments of the present invention will be described with reference to the attached drawings. In the following description, as a matter of convenience, a 1-bit digital signal will be referred to as an audio signal and an audio signal will be thus described using the term "1-bit audio signal". Alternatively, however, the 1-bit digital signal may be an image signal. Thus, an example of using a 1-bit digital signal as a video signal will be described in the end of the following detailed description.

FIG. 1 is a block diagram illustrating a semiconductor memory recording/reproducing apparatus 1 with a built-in level display apparatus 15 to which a signal level to which a signal processing device, a signal processing method, and a signal level display device of embodiments of the present invention is applied. Hereinafter, a specific example of a signal-level generator and a signal-level generating method used in any of the embodiments of the present invention will be described with reference to such a semiconductor memory recording/reproducing apparatus 1. Here, any of embodiments of the present invention is not only applicable to a semiconductor memory recording/reproducing apparatus but also applicable to an optical-disc recording/reproducing apparatus, and so on.

This semiconductor memory recording/reproducing apparatus 1 employs the built-in level display device 15 to display the level of a 1-bit audio signal output from an A/D converter or the level of a 1-bit audio signal incorporated from a semiconductor memory. The configuration and operation of this level display device 15 will be described later.

First, the configuration of the semiconductor memory recording/reproducing apparatus 1 and a system in which the semiconductor memory recording/reproducing apparatus 1 is responsible for a recording/reproducing process will be described.

The semiconductor memory recording/reproducing apparatus 1 includes a memory controller 10, a central processing unit/digital signal processor (CPU/DSP) 11, an A/D converter 12, a D/A converter 13, an operation unit 14, and the level display device 15. An input 1-bit audio signal is written in a semiconductor memory 16. In addition, an audio signal, which has been stored in the semiconductor memory 16, is read out of the memory 16 and then reproduced. The 1-bit audio signal, which has been written and read, is transmitted to the level display device 15. The level of such a signal is then generated and displayed on the level display device 15.

Specifically, the memory controller 10 controls the read and write of audio signals on the semiconductor memory 16 under the controls of the CPU/DSP 11. In other words, under the controls of the CPU/DSP 11, the memory controller 10 temporally stores various kids of data such as audio data based on a generated digital signal D and controls writing of various kinds of data such as the audio data into the semiconductor memory 16. The memory controller 10 controls reading of various kinds of data such as the audio data from the semiconductor memory 16 and then supplies the read data to the CPU/DSP 11.

The CPU/DSP 11 is connected to the semiconductor memory 16 through the memory controller 10 and also connected to a level generator 15 that generates and displays a signal level. The CPU/DSP 11 controls the memory controller 10, the A/D converter 12, and the D/A converter 13 in response to an operation signal or the like from the operation unit 14.

The A/D converter 12 converts an analog signal from a signal input terminal 17 into a digital signal D and then supplies a digital signal A to the CPU/DSP 11.

The D/A converter 13 receives a digital signal D from the CPU/DSP 11, which is a signal read out from the semiconductor memory 16 under the controls of the CPU/DSP 11. Then, the D/A converter 13 converts the digital signal D into an analog signal A. The generated analog signal A is output by a power amplifier or the like (not shown) through a signal output terminal 18.

The operation unit 14 is designed as a surface panel or the like (not shown) and includes a display unit composed of a liquid crystal panel or the like. The display unit has various kinds of operation keys thereon. Depending on the user's instruction through the keys on the display panel or the like, the operation unit 14 specifies recording of various kinds of data into the semiconductor 16 or reproduction of various kinds of data therefrom.

Here, the recording/reproduction process of the semiconductor memory recording/reproducing apparatus 1 will be described for specifically illustrating the operation of each of the above structural components.

The semiconductor memory 16 directory stores a 1-bit audio signal generated from a ΔΣ modulator. FIG. 4 illustrates a ΔΣ modulator 30 that generates a 1-bit audio signal. The ΔΣ modulator 30 obtains the difference (Δ) between the input analog signal A and the integral (Σ) of the output 1-bit signal by the adder 31 and then supplies the resulting difference (Δ) to a 1-bit quantizer 32. An output signal consists of bits of logic 0 and logic 1. As shown in FIG. 5, logic 0 and logic 1 express +1 and −1 as actual values, respectively.

The integrator 33 accumulates 1-bit output signals and then outputs the sum of values followed by the value of an input analog signal A. The 1-bit quantizer 32 increments the cumulative value by +1 or reduces the cumulative value by '1 per bit generated. A high sampling frequency is provided for allowing the sum of values to sufficiently follow a change in analog signal A. For example, the sampling frequency of a 1-bit audio signal D may reach to 64 fs (=2.8224 Hz) when a sampling frequency of CD is 44.1 kHz/16 bit (i.e., 1 fs).

Furthermore, the 1-bit audio signal D is processed by the CPU/DSP 11 that has received an instruction from the operation unit 14 and then stored in the semiconductor memory 16 through the memory controller 10. The 1-bit audio signal D is also supplied to the level display device 15.

On the other hand, in the reproduction process, first, when the CPU/DSP 11 receives an instruction from the operation unit 14, the CPU/DSP 11 fetches a 1-bit audio signal stored in the semiconductor memory 16 through the memory controller 10 and then supplies the 1-bit audio signal to the D/A converter 13.

Figure 6:
FIG. 6 is a block diagram illustrating a wave-shaping circuit and an analog low-pass filter in a D/A converter where a 1-bit audio signal is converted into an analog audio signal.

FIG. 6 illustrates a wave-shaping circuit 40 and an analog low-pass filter 41 in the D/A converter 13 where the 1-bit audio signal D is converted into an analog audio signal A". In the wave-shaping circuit 40, the 1-bit audio signal D is shaped from simple bit information into a wave form as shown in FIG. 5 and converted into an analog audio signal A'. In this stage, the waveform of the analog audio signal A' includes a frequency component out of an audible range. Thus, the frequency component out of the audible range is removed from the waveform, so that the analog audio signal A' is converted into an analog audio signal A". Here, the 1-bit audio signal D is also supplied to the level display device 15.

Next, the configuration and operation of the level display device 15 according to the embodiment of the present invention. The level display device 15 includes a level generator 20 for generating the level of a supplied 1-bit audio signal and a level display unit 21 for displaying the level generated from the level generator 20. In the level display device 15 of the present embodiment, 1-bit audio signals D are sequentially input from the ΔΣ modulator 30 into the level generator 20. The 1-bit audio signal D is qualified as a bit pattern and the bit pattern is then used as an index. A signal level is generated by reading the resulting value of an arithmetic operation corresponding to the index from a look-up table previously incorporated in the system. Subsequently, the signal level is displayed on the level display unit 21 in response to the signal level generated from the level generator 20.

Figure 7:
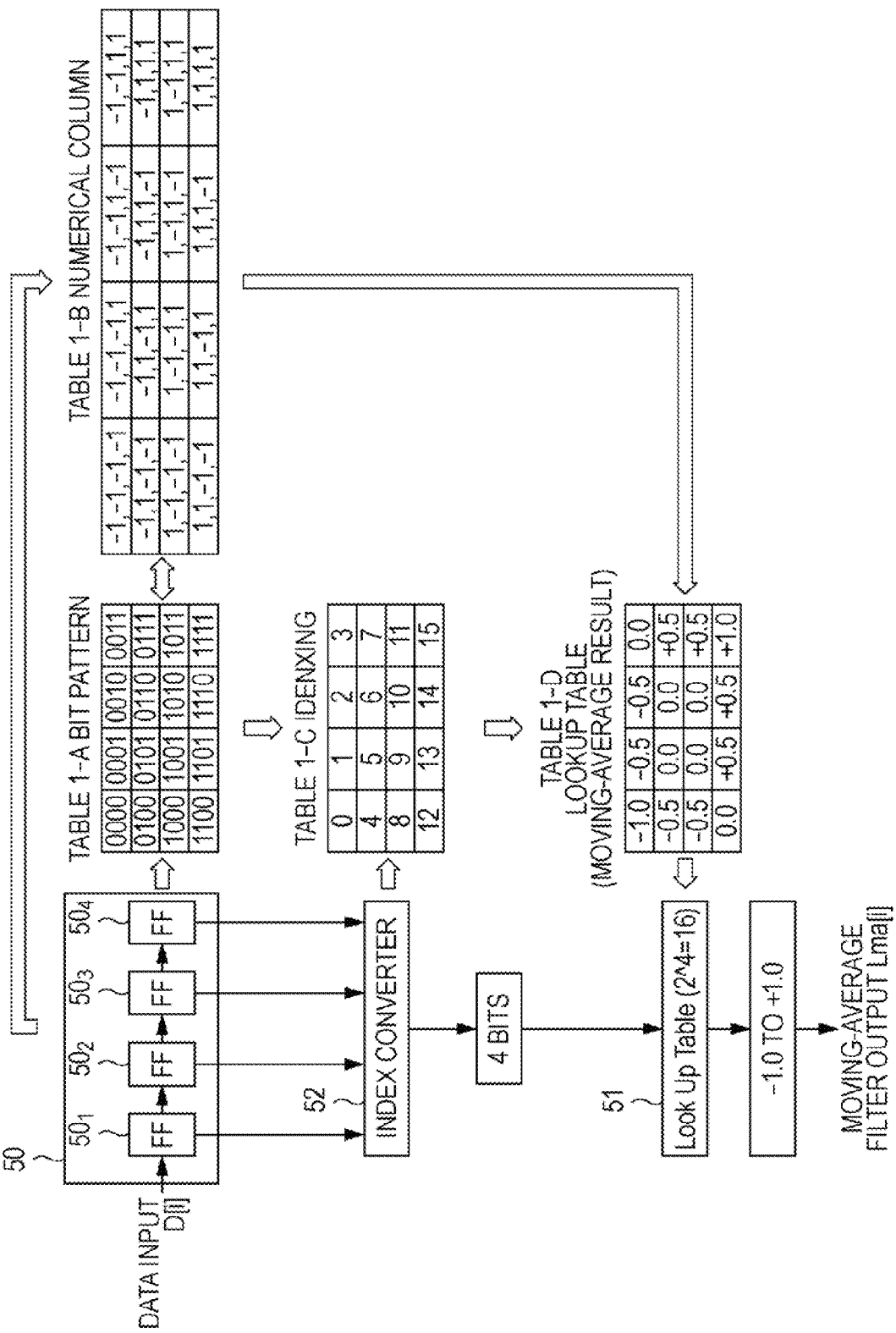
FIG. 7 is a block diagram illustrating a level generator in a level display device according to an embodiment of the present invention and a process of level generation in the level generator.

FIG. 7 is a block diagram illustrating the level generator 20 in the level display device 15 according to the embodiment of the present invention and provided for describing a process of level generation in the level generator 20. Referring now to FIG. 7, the process of level generation in the level generator 20 will be described. The following description assumes that a level may be generated by the moving-average filtering operation.

As shown in FIG. 7, the level generator 20 includes a bit-pattern output unit 50, a look-up table storage unit 51, and an index converter 52. The bit-pattern output unit 50 is constructed of n memory FFs $50_1$ to $50_n$ (n=4 in the example shown in FIG. 7) for 1-bit audio signal D[i] each constructing of flip-flop (FF) circuits. The look-up table storage unit 51 shows a result of the moving-average filtering operation for all bit patterns consisting of input 1-bit audio signals D[i] lined in chronological order. The index converter 52 considers that the 1-bit audio signals D[i] stored in the memory FFs $50_1$ to $50_n$ correspond to bit patterns of n bits. The index converter 52 converts the bit patterns output from the bit pattern output unit 50 into address values as indexes of n bits. In the example shown in FIG. 7, furthermore, the bit-pattern output unit 50 including four memories, memory FFs $50_1$ to $50_4$, outputs bit patterns of 4 bits and the index converter 52 represents decimal numerals as indexes of bit patterns of 4 bits.

When 1-bit audio signals D[i] are input, the level generator 20 sequentially stores the 1-bit audio signals D[i] into the memory FFs $50_0$ to $50_{n-1}$ of the bit-pattern output unit 50 in a manner similar to the related-art moving-average filtering operation. As described above, the memory FFs $50_1$ to $50_n$ include flip-flop (FF) circuits or the like and store a sequence of the predetermined number n of 1-bit digital signals by shifting a 1-bit audio signal input through the signal input terminal. A value of a 1-bit digital signal sequence stored in this memory FFs $50_1$ to $50_n$ is not an actual value (−1/+1) but a logical value (0/1). Thus, the value is directly stored without modification. Although a moving average filer having sufficient low-pass characteristics may preferably use several tens of taps. In the following description, however, the number (N) of taps is N=4 as a matter of convenience. As shown in FIG. 7, furthermore, the number (N) of the memory FFs $50_1$ to $50_n$ is N=4. Thus, the memory FFs $50_1$ to $50_4$ are provided.

A series of 1-bit audio signals sequentially stored in the memory FFs $50_1$ to $50_4$ is output as a simple bit pattern as described above. That is, the level generator 20 in the level display device 15 takes advantage of a fact that an input 1-bit audio signal D[i] has only binary values, logical values 0 and 1, and the bit-pattern output unit 50 combines 1-bit audio signals D[i] stored in the respective memory FFs $50_1$ to $50_4$ in chronological order, followed by outputting them as a simple bit pattern. The example shown in FIG. 7, for example is N=4. Thus, the number of different varieties of all bit patterns of input 1-bit digital signals D[i] is the fourth power of two. Therefore, 16 different bit patterns may be present.

In the level display device 15 of the present embodiment, the level generator 20 generates a table such as Table 1-A in FIG. 7 for all the bit patterns of input 1-bit digital signals D[i]. However, a value to be processed by filter processing is not a logical value but an actual value. Thus, the level generator 20 generates Table 1-B where the values of Table 1-A are converted into actual values. In other words, the relationship between Table 1-A and Table 1-B corresponds to the relationship between the logical values and the actual values.

Subsequently, the level generator 20 generates Table 1-D that calculates a value of the result of the moving-average filtering operation. In other words, the level generator 20 sequentially adds actual values of each of bit patterns of all the input 1-bit audio signals D[i] with reference to the actual values listed in Table 1-B and the sum thereof is then divided by the tap number N=4. The result of the calculation is listed in Table 1-D>

In the level display device 15 of the present embodiment, as described above, the level generator 20 generates a table such as one represented as Table 1-D in advance. The table is previously stored in a look-up table storage unit 51 so that the table will be used as a look-up table. In other words, the level generator 20 incorporates a look-up table showing the moving-average result as represented by Table 1-D into a system in advance. Therefore, the arithmetic operation is accelerated by using such a table as a look-up table. On the other hand, the level generator 20 includes the index converter 52 as shown in FIG. 7. The index converter 52 converts the bit pattern in Table 1-A of FIG. 7 into an address value as a n-bit index. For example, the decimal numerals listed in Table 1-C are generated as indexes of bit patterns of 4 bits listed in Table 1-A. The decimal numerals listed in Table 1-C may be used as indexes of Table 1-D.

In other words, as shown in FIG. 7, the index "0" in Table 1-C corresponds to the bit pattern "0000" in Table 1-A and also corresponds to the moving-average result "−1.0" in Table 1-D, which is the result of the moving average calculated from the bit pattern based on the actual value (−1/+1). Similarly, the index "1" corresponds to the bit pattern "0001" in Table 1-A and the moving-average result "−0.5" in Table 1-D. In addition, the index "2" corresponds to the bit pattern "0010" in table 1-A and the moving-average result "−0.5" in Table 1-D. In this way, the indexes "0" to "15" correspond to both the bit patterns in Table 1-A and the moving-average results in Table 1-D provided as a look-up table, respectively.

In addition, the index converter 52 makes indexes of parallel bit patterns of 1-bit audio signals D[i] which are actually input in the memory FFs $50_1$ to $50_4$ and aligned and out in chronological order. For example, the indexes may be represented by decimal numerals. Therefore, the bit patterns of input 1-bit audio signals D[i] may correspond to the indexes in Table 1-C which are previously indexed for all the bit patterns.

It is noted that the index converter 52 is not limited to the decimal representation of bit-pattern indexes. The bit-pattern index may be any of other kinds of representation as far as it may an address accessible to the result of the filtering arithmetic operation on a look-up table corresponding to bit patterns output from the bit-pattern output unit 50. Hardware or software is able to calculate binary indexes so that Table 1-A will be directly used as Table 1-D without conversion to a predetermined address value.

Thus, the level display device 15 of the present embodiment stores a look-up table showing the results obtained from the calculation with the moving-average filtering operation into the look-up table storage unit 51. When the memory FFs $50_1$ to $50_4$ stores the input 1-bit audio signals D[i], the bit-pattern output unit 50 that constitute the memory FFs $50_1$ to $50_4$ outputs a series of 1-bit audio signals D[i] as parallel bit patterns aligned in chronological order as shown in Table 1-A.

The index converter 52 converts output bit patterns into address values as indexes of bit patterns of 4 bits. For example, as shown in FIG. 7, output bit patterns are represented by decimal numerals. The index convertor 52 generates converted values correspond to the indexes listed in Table 1-C by carrying out numerical conversion based on Table 1-A in advance. On the basis of the indexes listed in Table 1-C, the results of the moving-average filtering operation corresponding to the indexes are read out from the look-up table, Table 1-D, where the calculated results of the moving-average filtering operation is represented.

The level display device 15 of the present invention reads out the results of the filtering arithmetic operation is read out from a look-up table stored in the look-up table storage unit 51 using as indexes the bit patterns output from the memory FFs $50_1$ to $50_4$. Thus, the results of the moving-average filtering operation may be obtained without performing the related art filter processing or count process at all. Therefore, the results will be completely equivalent to the result of the filtering arithmetic operation or count process without an increase in load on arithmetic processing at extremely high speed.

Here, a case in which 1-bit audio signals D[i] are sequentially stored in the memory FF (i.e., "0" stored in the memory FF $50_1$, "1" in the memory FF $50_2$, "1" in the memory FF $50_3$, and "1" in the memory FF $50_4$) will be described with reference to an example.

First, if input 1-bit audio signals D[i] stored in the memory FFs $50_1$ to $50_4$ are considered as bit patterns, the pattern of "0111" was obtained. If the bit pattern "0111" of the input 1-bit audio signal D[i] is output from the bit pattern output unit 50, then the bit pattern "0111" is converted into a decimal numeral or the like in the index converter and the index "7" is then derived. In other words, the output bit pattern is used as an index. Alternatively, the bit pattern "0111" may be directly used as an index.

On the other hand, the level generator 20 actually converts each bit pattern of the input 1-bit audio signal D[i] into a value, adds each value of the converted numerical sequence, and divides the sum by the number N of taps. Subsequently, the level generator 20 previously generates a look-up table, Table 1-D, which shows a calculated result of the moving-average filtering operation. The level generator 20 then stores the result into the look-up table storage unit 51. In addition, in the index converter 52, each display of the look-up table, Table 1-D, is indexed by correlation with the respective values of Table 1-C.

Therefore, the decimal index "7" is applied from the bit pattern "0111" of the input 1-bit audio signal to the index display of Table 1-C, the result of the moving average calculation, "+0.5", is easily obtained from the index "7" among the indexes listed in the look-up table, Table 1-D. Similarly, for example, when a 1-bit audio signal D[i], "1", is stored in the memory FF $50_1$, "0" into the memory FF $50_2$, "1" into the memory FF $50_3$, and "0" into the memory FF $50_2$ "0", these values are bit-patterned to "1010" and represented by the decimal index "10". The resulting bit pattern is correlated with the index of the look-up table, Table 1-D, previously stored in the look-up table storage unit 51. As a result, the moving-average result of 1-bit audio signals D[i] with a bit pattern of a decimal value "10" is calculated as "0.0" from the index "10" among the indexes of the look-up table, Table 1-D.

When compared with the level generation with product-sum operation or count-processing on all of "N" inputs of 1-bit audio signals D[i], the level display device 15 of this embodiment can obtain the same results as those calculated by such a level generation at very high speed. In other words, the level display device 15 of the present embodiment stores the look-up table, Table 1-D, in advance. This look-up table represents the calculated result of the moving-average filtering operation for all bit patterns of input 1-bit audio signals D[i]. Only "N" inputs, which have been actually entered, are indexed and the resulting index values are then used for picking up the corresponding values of the results of filtering arithmetic operation from the calculated look-up table, Table 1-D.

Therefore, the level display device 15 of the present embodiment does not employ a multiplier, an adder, and the like, which have been installed in the related-art level display device. Therefore, the level display device 15 of the present embodiment is able to perform the arithmetic operation at high speed and extensively reduce load of the filtering arithmetic operation on the system.

In the case of the above example (the number of taps, N=4), the look-up table corresponding to 16 different bit patterns, which is previously stored in the system, may be prepared in advance. In the case of N=6, a look-up table is prepared as one corresponding to 64 different bit patterns. In the case of N=3, a look-up table is prepared as one corresponding to 256 different bit patterns. Therefore, it means that a look-up table to be prepared corresponds to the "N"th power of 2 ($2^N$) of different bit patterns. However, if N is too high, then $2^N$ becomes extremely high. Thus, it is necessary to reserve a sufficient capacity of the look-up table storage unit 51 for previously storing a look-up table corresponding to the $2^N$ different bit patterns. In other words, therefore, N may be set up to an appropriate value in terms of usefulness.

Figure 8:
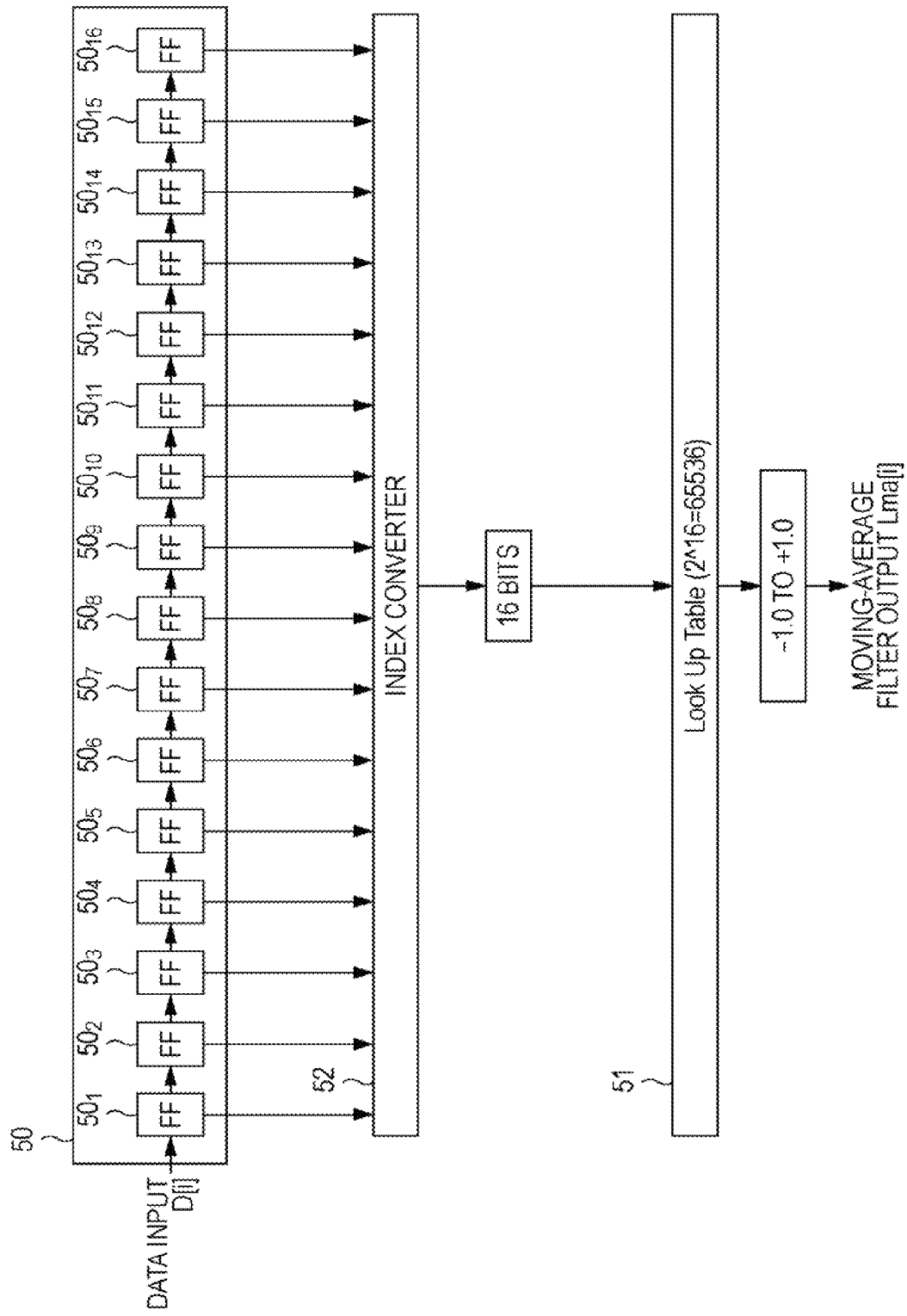
FIG. 8 is a block diagram illustrating a level generator when considering the use of a-moving average filter with 16 taps (N=16)

For example, if it is assumed that a moving average filter of N=16 as shown in FIG. 8 is used, a desired look-up table corresponding to $2^N=65536$ (65 KB) is implementable in LSI/DSP. However, such a table is too large in terms of usefulness, causing the necessity of a memory with an enough capacity to store the 65-KB look-up table.

In contrast, the level display device 15 of the present embodiment receives a 1-bit digital signal obtained by ΔΣ modification. Parallel bit patterns output from the bit-pattern output unit is considered as one consisting of m partial bit patterns of n bits. The partial bit patterns of n bits are indexed and the above look-up table is then referenced every m partial bit patterns to output the result of filtering arithmetic operation corresponding to the partial bit patterns. Furthermore, the level generator 20 of the level display device 15 includes a combining unit for combining m values of the results of the filtering arithmetic operation. As a second step of the processing, the combining unit combines m resulting values of the filtering arithmetic operation which are output every m partial bit patterns to output the results of the filtering arithmetic operation of the input 1-bit digital signals.

Figure 9:
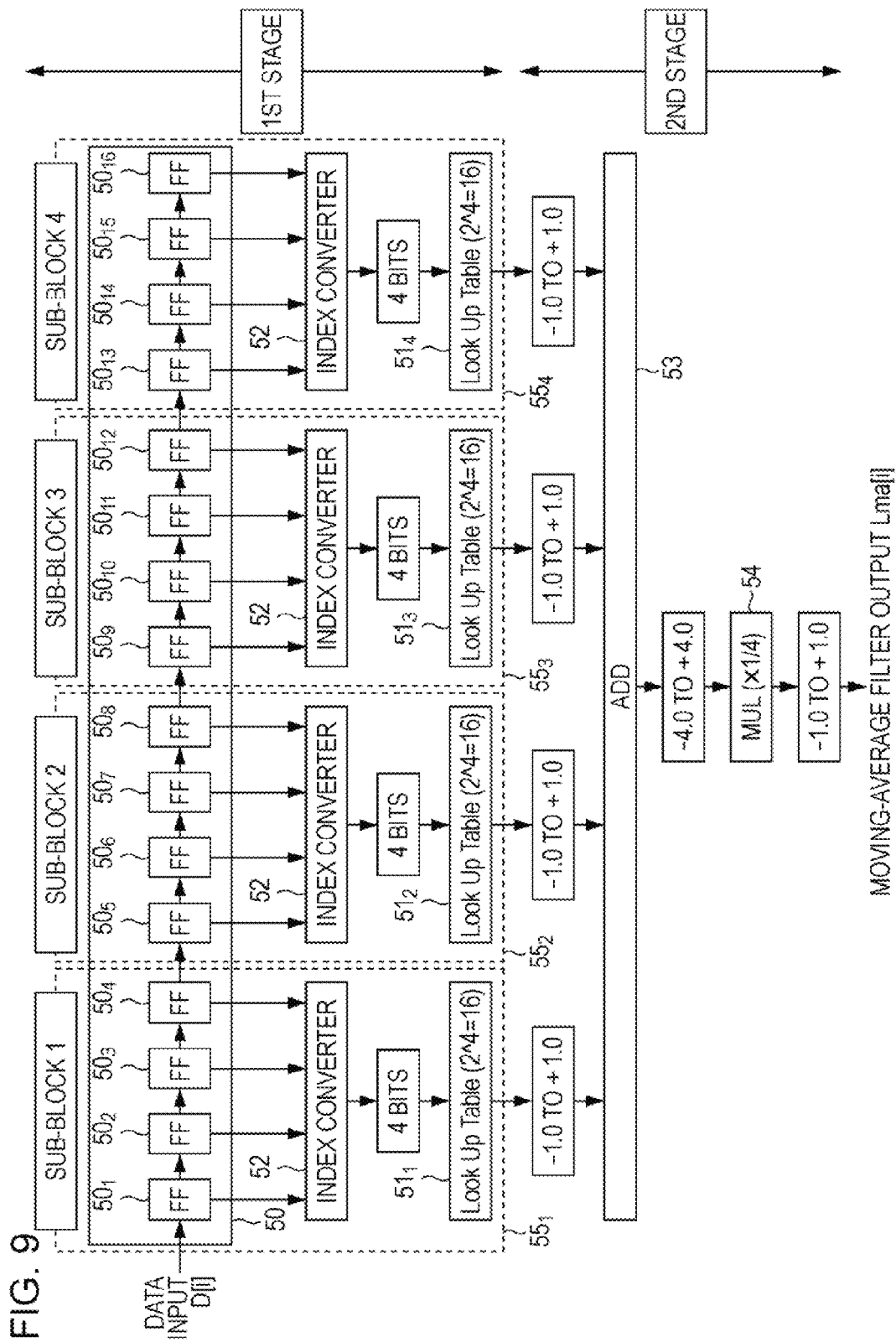
FIG. 9 is a block diagram illustrating a process with a plurality divided of sub-blocks.

Specifically, for example, if the filtering arithmetic operation is carried out for N=16 as shown in FIG. 9, 1-bit audio signals D[i] sequentially stored in the memory FF 500 to 5015 are divided into four sub-blocks 551 to 554 of 4+4+4+4 as the 1st stage of the processing.

In other words, parallel bit patterns output from the bit-pattern output unit 50 after receiving 1-bit audio signals D[i] are considered as four partial bit patterns of 4 bits. In the sub-blocks 551 to 554, each of the partial bit patterns of 4 bits is employed as an index to refer a look-up table every four bit patterns. Thus, four resulting values of the filtering arithmetic operation corresponding to the respective partial bit patterns are output.

After that, as second-step processing, a look-up table stored in the look-up table storage unit 511 to 514 for the respective sub-blocks 551 to 534 are referenced to add four resulting values of each of the sub-blocks 551 to 554 are added together by an adder 53 on the basis of the results of the moving-average filtering operation output every partial bit pattern. A result of the moving-average filtering operation of the inputted 1-bit digital signal is calculated to a result obtained by adding machine 53 by carrying out the multiplication of the reciprocal of 4 which is the number of sub-blocks using multiplier 54.

If one block is divided into four sub-blocks as described above, the number (N) of taps in each of the sub-blocks 551 to 554 is represented by N=4. It is the same as one in the exemplified arithmetic operation of level generation illustrated in FIG. 7. Thus, the detailed description of the process of outputting a value as a result of filter arithmetic operation with reference to the 1st-stage look-up table will be omitted. Therefore, for example, a moving average filter is divided into a plurality of sub-blocks in the level display device 15. Then, the level display device considers parallel bit patterns where 1-bit digital signals D[i] are aligned in chronological order as m partial bit patterns and then outputs m bit patterns. Each of m output partial bit patterns are provided as indexes. Subsequently, the resulting value of filter arithmetic operation corresponding to each partial bit pattern is output with reference to a look-up table every partial bit pattern. When the calculation for obtaining the result of the moving-average filtering operation is carried out at high speed, the look-up tables used in the respective sub-blocks 551 to 554 may be identical because of carrying out the same processing. In other words, the look-up table storage unit 511 to 514 may store the same look-up table. Therefore, the size of the look-up table may be one corresponding to 16 different bit patterns in the case of N=4. When compared with a case in which the look-up table with a size of $2^16=65536$ is used as shown in FIG. 8, a filter of 1/4096 in size may be constructed. Thus, it becomes possible to carry out the level generation very effectively.

As described above, the level display device 15 of the present embodiment carries out the processing by dividing a moving average filter of N taps into a plurality of sub-blocks and using a look-up table for each of divided sub-blocks. Therefore, level generation will be performed effectively without preparing and storing a look-up table with a sufficiently storage capacity.

Figure 10:
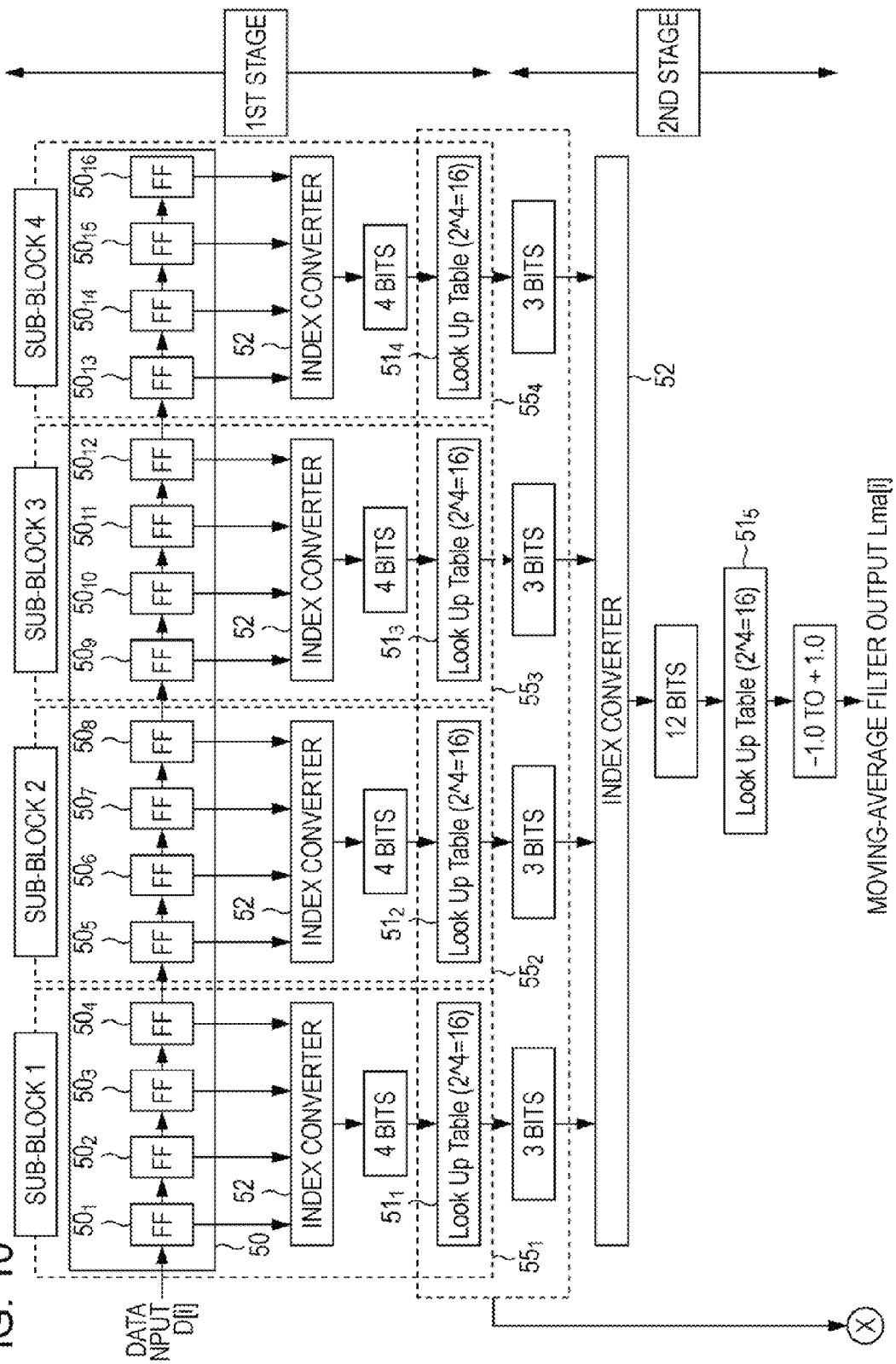
FIG. 10 is a block diagram illustrating a process with a plurality divided of sub-blocks.

In the above process of level generation as described as the example (N=16) shown in FIG. 9, the usual numerical arithmetic operation is used as second-stage processing. Alternatively, as shown in FIG. 10, the second-stage processing may be carried out using look-up tables to accelerate the level-generation processing.

Namely, in the first-stage processing like the example shown in FIG. 9, in memory FFs $50_0$ to $50_{n-1}$, bit patterns obtained by aligning 1-bit digital signals generated by ΔΣ modification in chronological order are considered as m partial bit patterns of n bits. Each of the partial bit patterns is then output. Subsequently, each of m output partial bit patterns is used as an index to output the resulting value of filter arithmetic operation corresponding to each partial bit pattern with reference to a look-up table every partial bit pattern. On the other hand, as shown in FIG. 10, the level generator 20 has a second look-up table which is generated by converting the result of filter arithmetic operation for each of the partial bit patterns into a bit pattern. The bit pattern obtained by bit-patterning the value of the filtering arithmetic operation for each partial bit pattern is used as an index. The resulting value of filter arithmetic operation for each partial bit pattern is then output with reference to the second look-up table.

Specifically, for example, the look-up table, Table 1-D, includes five different values "−1.0/−0.5/0.0/+0.5/+1.0" as a result of the moving-average filtering operation. The level generator 20 converts these five different values into bit patterns. In the case of the bit-patterning of these five different values, bit patterns of 3 bits ($2^2$ bits=4<5<8=$2^3$ bits) are typically used. The level generator 20 converts these five different values into bit patterns, for example, those listed in Table 2 of FIG. 11A. In this example, the bit pattern "011/100/111" is an unnecessary bit pattern, so that it is displayed as "INHIBIT".

Figures 11A, 11B:
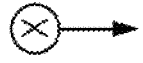
FIG. 11A illustrates a table that represents a relationship between five different values shown in Table 1-D of FIG. 7
FIG. 11B illustrates a table that represents bit patterns converted from the values listed in the table of FIG. 11A.

In the case of Table 1-D shown in FIG. 7, the values may be converted into bit patterns as shown in Table 2 of FIG. 11A. Thus, the level generator 20 may replace Table 1-D of FIG. 5 with bit patterns as shown in Table 3 of-FIG. 11B on the basis of Table 2.

As first-stage outputs from four sub-blocks 551 to 554 in FIG. 10, numerical values listed in Table 3 of FIG. 11B are obtained. When these outputs are aligned and combined together, bit patterns of 12 bits (3 bits×4 sub-blocks) will be obtained.

In this way, the second look-up table is generated in advance. Here, this second look-up table corresponds to bit patterns of 12 bits (3 bits×4 sub-blocks) shown in Table 3 of FIG. 11B and is used in the second-stage processing. The second look-up table is then stored in the look-up table storage unit 515. Therefore, the result of arithmetic operation will be easily obtained by simply picking up a value from the look-up table without carrying the numerical operation shown in FIG. 9.

In this example, a table adaptable to $2^{12}$=4096 different patterns is typically used as the second look-up table used in the second-stage processing stored in the look-up table storage unit 515. When compared with the example shown in FIG. 8, such a table is 1/16 in size and remarkably predominant. Furthermore, the process of using the first-stage result to pick up a value to be used in the second-stage processing from the second look-up table is the same as one used in the first-stage processing. Thus, the detailed description thereof is omitted.

The present embodiment has been described with reference to the example in which the block is divided into four sub-blocks and then subjected to the two-stage processing. Alternatively, the size of the sub-block and the number of stages in the processing may be arbitrarily changed to any of others.

By the way, the example used in the description so far uses the look-up table that displays a value calculated by the moving-average filtering operation which is simplified because of without using a filter factor. Obviously, the processing may be carried out using a look-up table that displays values calculated by typical filtering arithmetic operation having arbitral values as filter factors. Hereinafter, as a second embodiment of the present invention, an example of filtering arithmetic operation having arbitral values as filer factors C will be concretely described with reference to FIG. 12.

First, like FIG. 7, memory FFs $50_1$ to $50_4$ for 1-bit audio signal D are prepared and an 1-bit audio signal D[i] is stored in each of them one by one. In this case, the value to be stored is not an actual value. A logical value is directly stored. Then, the bit-pattern output unit 50 utilizes a fact that the 1-bit audio signal D[i] has only the logical values 0 and 1 in binary to combine the 1-bit audio signals D[i] stored in the memory FFs $50_1$ to $50_4$ in chronological order, followed by outputting them simple bit patterns. For example, like the example shown in FIG. 1, the number of taps is N=4. Thus, the number of bit patterns may be the forth power of 2. Furthermore, in this embodiment, the level generator 20 generates a table of 16 different bit patterns such as Table 4-A in FIG. 12. Also, in the case of using filtering arithmetic operation in which a filter factor C is an arbitrary value, a value to be processed in the filtering arithmetic operation is not logical values (0/1) but actual values (−1/+1). Thus, the level generator 20 converts values of Table 4-A into actual values such as those of Table 4-B in FIG. 12. In other words, the relationship between Table 4-A and Table 4-B corresponds to the relationship between the logical values and the actual values.

Figure 12:
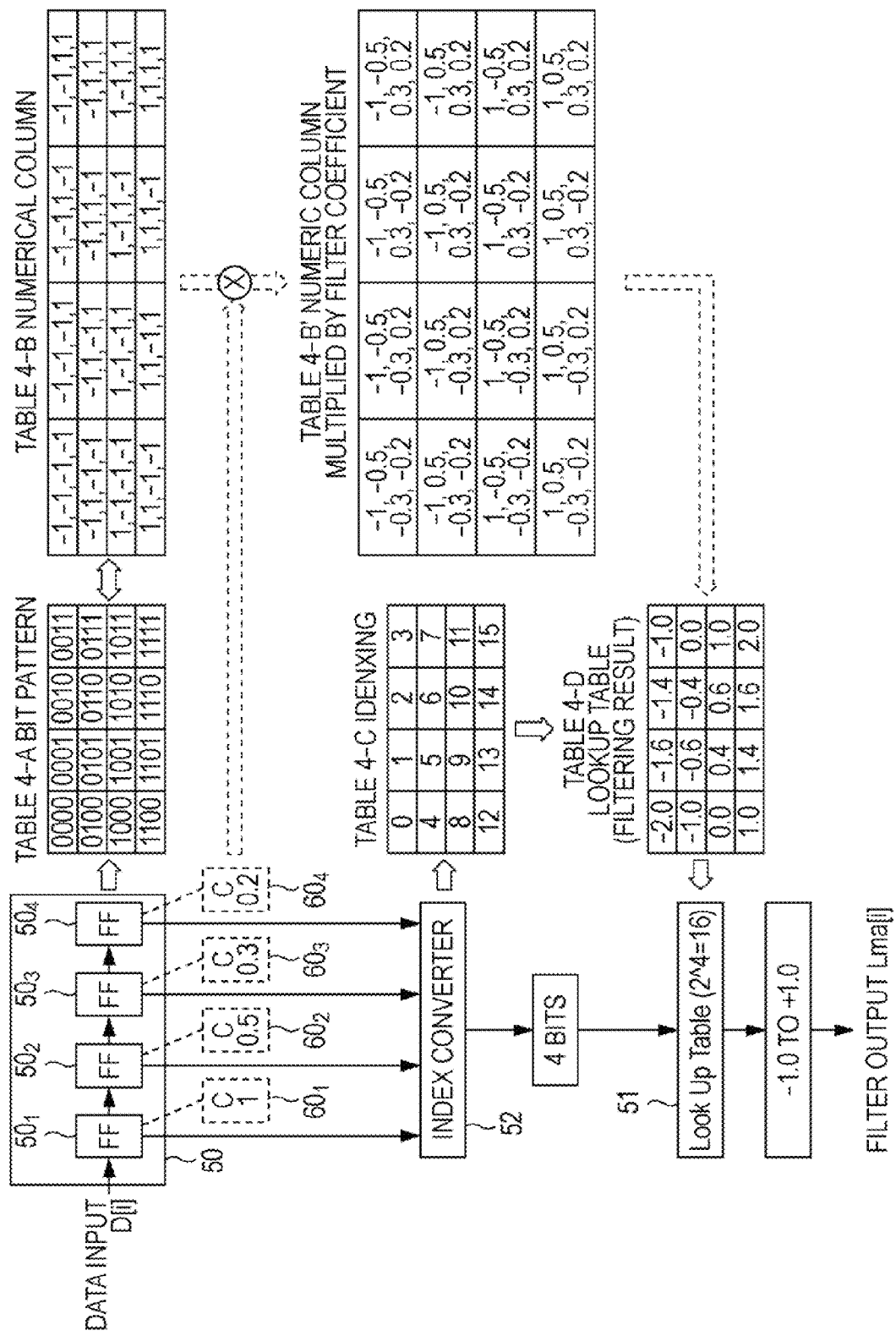
FIG. 12 is a diagram illustrating a method for executing a level generation process using a look-up table that represents values calculated by a typical filtering arithmetic operation having arbitrary values for filter factors.

Here, the example shown in FIG. 12 does not realize the processing using a moving average filter but realizes filtering arithmetic operation having arbitrary values as general filter factors. Therefore, filter factors C$60_1$ to $60_4$ exist in the memory FFs $50_1$ to $50_4$, respectively. In this example, furthermore, the filter factor C603 is "1", the filter factor C$60_2$ is "0.5", and the filter factor C$60_3$ is "0.3", and the filter factor C$60_4$ is "0.2".

In the related-art method, a filter result has been obtained by carrying out a convolution arithmetic operation using the file factor C and the memory FF for 1-bit audio signal D (not a logical value but an actual value). Such a related-art method performs the arithmetic operation of each input signal every time a 1-bit audio signal D[i] is input by using a multiplier and an adder. Load of the arithmetic operation increases extensively as the number of taps (N) increases, leading to a limit of high-speed processing.

In contrast, the level display device 15 according to the second embodiment of the present invention, the filter arithmetic operation is not performed at all. The filter factors C$60_1$ to $60_4$ are designed to effect on Table 4-B in FIG. 12.

Specifically, the level generator 20 of the level display device 15 generates Table 4-B' by multiply the values of the respective patterns in Table 4-B, where parallel bit patterns of input 1-bit audio signals D[i] aligned in chronological order are converted into actual values, by filter factors C$60_1$ to $60_4$, respectively. This is equivalent to multiplying the memory FFs 501 to $50_4$ with the filter factors C$60_1$ to $60_4$, respectively. The level generator 20 adds all of values in each pattern of Table 4-B' to generate Table 4-D which corresponds to the results of a typical filtering arithmetic operation.

Therefore, in the level display device 15 of the present embodiment, the level generator 20 generates a table such as one represented as Table 4-D generated by multiplication with filter factors C$60_1$ to $60_4$ and then stores such a table in the look-up table storage unit 51 in advance so as to the table as a look-up table. In other words, the level generator 20 incorporates the look-up table showing the filtering results such as those represented in Table 4-D into the system in advance and then uses it as a look-up table. Therefore, the level display device 15 of the present embodiment is able perform an arithmetic operation at a speed higher than the related-art method that performs an arithmetic operation using a multiplier and an adder. In addition, the index converter 52 of the level generator 20 converts the bit patterns of Table 4-A into address values as indexes of n bits. For example, Table 4-C represented by decimal numerals is generated as a table of indexes that correspond to the bit patterns of 4 bits in Table 4-A. Here, the indexes in Table 4-C may be used as indexes in Table 4-D as described above. In other words, as shown in FIG. 10, the index "0" in Table 4-C corresponds to the bit pattern "0000" in Table 4-A and also corresponds to the filtering result "−2.0" in Table 4-D calculated by a typical filtering arithmetic operation with filter factors based on the actual value (−1/+1). Likewise, the index "1" corresponds to the bit pattern "0001" in Table 4-A and also corresponds to the filtering result "−1.6" in Table 4-D. In addition, the index "2" corresponds to the bit pattern "0010" in Table 4-A and also corresponds to the filtering result "−1.4" in Table 4-D. Likewise, the indexes "0" to "15" correspond to the bit patterns in Table 4-A and also correspond to the filtering results in Table 4-D, respectively.

In addition, the index converter 52 makes indexes of parallel bit patterns of 1-bit audio signals D[i] which are actually input in the memory FFs $50_1$ to $50_4$ and aligned and out in chronological order. For example, the indexes may be represented by decimal numerals. Therefore, the bit patterns of input 1-bit audio signals D[i] may correspond to the indexes in Table 1-C which are previously indexed for all the bit patterns.

It is noted that the index converter 52 is not limited to the decimal representation of bit-pattern indexes. The bit-pattern index may be any of other kinds of representation as far as it may an address accessible to the result of the filtering arithmetic operation on a look-up table corresponding to bit patterns output from the bit-pattern output unit 50. Hardware or software is able to calculate binary indexes so that Table 4-A will be directly used as Table 4-D without conversion to a predetermined address value.

Thus, the level display device 15 of the second embodiment previously stores a look-up table showing the results obtained from the calculation with the typical filtering arithmetic operation into the look-up table storage unit 51. When the memory FFs $50_1$ to $50_4$ stores the input 1-bit audio signals D[i], the bit-pattern output unit 50 that constitute the memory FFs $50_1$ to $50_4$ outputs a series of 1-bit audio signals D[i] as parallel bit patterns aligned in chronological order as shown in Table 1-A.

The index converter 52 converts output bit patterns into address values as indexes of bit patterns of 4 bits. For example, as shown in FIG. 12, output bit patterns are represented by decimal numerals. The index convertor 52 generates converted values correspond to the indexes listed in Table 4-c by carrying out numerical conversion based on Table 4-A in advance. On the basis of the indexes listed in Table 1-C, the results of the typical filtering arithmetic operation having filter factors corresponding to the indexes are read out from the look-up table, Table 1-D, where the calculated results of the filtering arithmetic operation is represented.

The level display device 15 of the present embodiment uses bit patters as indexes 50, which are output from the bit-pattern output unit 50 including memory FF 500 to 503. Then, the level display device uses the indexes to read out the results of filter arithmetic operation from the look-up table stored in the look-up table storage unit 51. Thus, the results of the typical filtering arithmetic operation having filter factors may be obtained without performing a product-sum operation for the related-art general filtering arithmetic operation. Therefore, the results will be completely equivalent to the result of the filtering arithmetic operation or count process without an increase in load on arithmetic processing at extremely high speed.

Therefore, the level display device 15 of the present embodiment does not employ a multiplier, an adder, and the like, which have been installed in the related-art level display device. Therefore, the level display device 15 of the present embodiment is able to perform the arithmetic processing at high speed and extensively reduce load of the arithmetic processing on the system.

In the above description, as a matter of convenience, the 1-bit digital signal has been described as an audio signal and the audio signal has been described using the term "1-bit audio signal". Alternatively, however, the one-bit digital signal may be an image signal to which any embodiment of present invention will be applied in a manner similar to the above embodiments.

For example, the filtering arithmetic operation for audio signals which has been described above may be replaced with an interpolation process for image signal logic 0 of a 1-bit signal is set to "white" and logic 1 thereof is set to "black" and a time series of audio signals is then arranged in the order of vertical and horizontal pixels of image signals.

Specifically, four pixels arranged in the horizontal direction in image data, "1 (black), 1 (black), 0 (white), 0 (white)", will be considered as an example.

If these pixels are multiplexed by a moving average filter with taps (N=4), then it becomes (1+1+0+0)/4=0.5. Thus, it is found that an intermediate of 1 (black) and 0 (white), or 0.5 (gray), is obtained by averaging four pixels. It is also possible to perform this moving-average filtering operation using the high-speed processing technique with a look-up table which has been described using the above 1-bit audio signals.

In addition, various kinds of techniques, such as one for extending a filter in a plane two although various methods, such as extending a filter in two dimensions for image signals, may be appropriately employed as far as the look-up table of any embodiment of the present invention is in a size to be realized by software or hardware.

As described above, the level generation in the related-art level display device typically obtains a result by carrying out a product-sum operation on all of N inputs. On the other hand, in the level display device 15 of any of the embodiments of the present invention, only N inputs are indexed. The resulting indexes point calculated results in a look-up table. Thus, such indexes used for picking up the corresponding results of the filtering arithmetic operation from the look-up table. The same results as those obtained by the related-art technique can be obtained at an extremely high speed.

Therefore, even if the number of taps (N) increases, for example N=64 or N=128, the process may be performed without a complicated product-sum operation. Thus, it is possible to carry out the process at a high speed while preventing the load of arithmetic operation to the minimum, thereby obtaining the results equal to those obtained by one using the product-sum operation.

A high-speed filtering system with high flexibility may be designed by appropriately combining stages and sub-blocks in series or in parallel while taking an advantage of the high-speed level generation according to any of embodiments of the present invention. Any embodiment of the present invention may be used not only for level generation of 1-bit signals simply but also for picking up 1-bit or multiple-bit signals.

In this way, the embodiment of the present invention performs the level generation by the simple process using the look-up table. Therefore, even if there is no circuit for exclusive use, the level of a 1-bit digital signal is detected by CPU and software thereof. Since there is no problem of operation accuracy, a signal level may be uniquely determined.

When the level generation is attained by hardware, it is possible to realize the high-speed level generation with a small amount of load on the arithmetic operation by a simple circuit scale without using a multiplier and an adder. Furthermore, any of the embodiments of the present invention has a simple circuit structure so that the costs and power consumption of the device are reducible.

In addition, the level display device 15 may be installed in an optical disc reproducing apparatus, a semiconductor memory recording/reproducing apparatus, or the like. The built-in level display device 15 prevents the apparatus from causing a desired result such as variations of level display depending on the types of built-in reproduction, recording, and editing devices in spite of recording the same edited music on a plurality of optical discs.

The level display device 15 of any of the above embodiments is able to detect the level of 1-bit digital signal and the use of such a device allows an operator to know the signal level of reproduction or recording. In addition, the level-generating method monitors, for example, a reproduction level of an audio reproducing apparatus. Thus, it is possible to protect an amplifier or a speaker by automatically turning the output down when an input signal level is higher than a certain level.

This level display device 15 may be used for a level check of electronically filed sound data. These days, the data of sound is recorded, played and edited as a data file of a computer in many cases. When checking the level of sound in such a sound file, the level-generating method of any of the above embodiments avoids complicated signal processing. Therefore, the level-generating method of any of the above embodiments allows a user to check the data of a sound file to determine whether an unusually high level of sound is included in the file by using only CPU and the software thereof without specific hardware or without reproducing the sound once.

Furthermore, each step of the level-generating method as described herein includes procedures performed one by one with time in the order of description. Alternatively, the procedures may not be performed in chronological order. The procedures may be in parallel or independently performed.

The present application contains subject matter related to that disclosed in Japanese Priority Patent Application JP 2008-196641 filed in the Japan Patent Office on Jul. 30, 2008 the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing device comprising:
   a bit-pattern output unit for receiving input 1-bit digital signals generated by $\Delta\Sigma$ modification and aligning bits of said input 1-bit digital signals in a chronological order to output parallel bit pattern;
   a look-up table storage unit is for storing a look-up table that represents a relationship between said bit patterns output from said bit pattern output unit and resulting values of a filtering arithmetic operation on the basis of said bit patterns; and
   a bit patterns output from said bit-pattern output unit are provided as indexes for outputting the resulting values of said filtering arithmetic operation corresponding to said bit patterns listed in said look-up table stored in said look-up table storage unit.

2. The signal processing device according to claim 1, wherein the index of said bit pattern is an address of said look-up table representing the result of said filtering arithmetic operation.

3. The signal processing device according to claim 1 or 2, wherein
   output from said bit-pattern output unit are m partial bit patterns of n bits, said m partial bit patterns are used as indexes to reference said look-up table for each of said partial bit patterns to output m values of the result of the filtering arithmetic operation corresponding to said partial bit pattern,
   a combining unit for combining m values of the result of said parallel bit patterns is further provided, and
   said combining unit combines m values of the result of said filtering arithmetic operation which are output every partial bit pattern to output the result of said filtering arithmetic operation of said input 1-bit digital signals.

4. The signal processing device according claim 1 or 2, wherein
   output from said bit-pattern output unit are m partial bit patterns of n bits, said n partial bit patterns are used as indexes to reference said look-up table for each of said partial bit patterns to output m values of the result of the filtering arithmetic operation corresponding to said partial bit pattern,
   a second look-up table is generated by converting said values of the result of said filtering arithmetic operation every said partial bit pattern, and
   bit patterns obtained by converting the values of the result of said filtering arithmetic operation for each partial bit pattern is used as indexes to output the result of said filtering arithmetic operation corresponding to the bit pattern represented by said second look-up table.

5. The signal processing apparatus according to claim 1, wherein
   said filtering arithmetic operation is a process for signal level generation.

6. The signal processing apparatus according to claim 1, wherein
   said 1-bit digital signal is an audio signal.

7. The signal processing apparatus according to claim 1, wherein said 1-bit digital signal is an image signal.

8. A signal processing method, comprising the steps of: previously generating a look-up table storage unit that represents a relationship between parallel bit patterns prepared by aligning sequentially received input 1-bit digital signals in chronological order and resulting values of a filtering arithmetic operation on the basis of said bit patterns; receiving input 1-bit digital signals generated by $\Delta\Sigma$ modification; aligning bits of said input 1-bit digital signals in a chronological order to output parallel bit pattern; indexing said bit patterns output from said bit-pattern output unit; and using said indexes to output the resulting values of said filtering arithmetic operation corresponding to sad bit patterns listed in said look-up table stored in said look-up table storage unit.

9. A signal level display device comprising: a bit-pattern output unit for receiving input 1-bit digital signals generated by $\Delta\Sigma$ modification and aligning bits of said input 1-bit digital signals in a chronological order to output parallel bit pattern; a look-up table storage unit for storing a look-up table that represents a relationship between said bit patterns output from said bit pattern output unit and resulting values of a filtering arithmetic operation on the basis of said bit patterns; a signal level generator for using said bit patterns output from said bit-pattern output unit as indexes to output the resulting values of said filtering arithmetic operation corresponding to said bit patterns listed in said look-up table stored in said look-up table storage unit;

and a signal level display unit for displaying a signal level based on said resulting values of said filtering arithmetic operation output from said signal level generator.

10. The signal processing apparatus according to claim 2, wherein said filtering arithmetic operation is a process for signal level generation.

11. The signal processing apparatus according to claim 3, wherein said filtering arithmetic operation is a process for signal level generation.

12. The signal processing apparatus according to claim 4, wherein said filtering arithmetic operation is a process for signal level generation.

13. The signal processing apparatus according to claim 2, wherein said 1-bit digital signal is an audio signal.

14. The signal processing apparatus according to claim 3, wherein said 1-bit digital signal is an audio signal.

15. The signal processing apparatus according to claim 4, wherein said 1-bit digital signal is an audio signal.

16. The signal processing apparatus according to claim 5, wherein said 1-bit digital signal is an audio signal.

17. The signal processing apparatus according claim 2, wherein said 1-bit digital signal is an image signal.

18. The signal processing apparatus according claim 3, wherein said 1-bit digital signal is an image signal.

19. The signal processing apparatus according to claim 4, wherein said 1-bit digital signal is an image signal.

20. The signal processing apparatus according to claim 5, wherein said 1-bit digital signal is an image signal.

21. The signal processing apparatus according claim 1, wherein said look-up table storage unit includes result from a moving-average filtering operation.

22. The signal processing method according claim 8, wherein said look-up table storage unit includes result from a moving-average filtering operation.

23. The signal level display device according claim 9, wherein said look-up table storage unit includes result from a moving-average filtering operation.

\* \* \* \* \*